United States Patent
Yamamoto

(12)
(10) Patent No.: US 6,580,468 B1
(45) Date of Patent: Jun. 17, 2003

(54) TELEVISION TUNER WITH SUPPRESSED ATTENUATION OF LEVEL OF VIDEO INTERMEDIATE FREQUENCY WITH RESPECT TO RISE IN AMBIENT TEMPERATURE

(76) Inventor: Masaki Yamamoto, c/o Alps Electric Co., Ltd., 1-7 Yukigaya, Otsuka-cho, Ota-ku, Tokyo (JP)

(*) Notice: Subject to any disclaimer, the term of this patent is extended or adjusted under 35 U.S.C. 154(b) by 0 days.

(21) Appl. No.: 09/526,402

(22) Filed: Mar. 15, 2000

(30) Foreign Application Priority Data

Mar. 18, 1999 (JP) .......................................... 11-073473

(51) Int. Cl.[7] .................................................. H04N 5/50
(52) U.S. Cl. ............................ 348/731; 348/735; 334/6
(58) Field of Search ................................. 348/731, 732, 348/735; 334/5, 6; 455/164.2, 254, 283, 217, 197.2

(56) References Cited

U.S. PATENT DOCUMENTS 3,619,803 A * 11/1971 Klein .............................. 331/8
3,624,512 A * 11/1971 Evans .......................... 325/422
4,160,213 A *  7/1979 Carter .......................... 325/439
4,260,956 A *  4/1981 Harford ....................... 330/289
4,271,433 A *  6/1981 Theriault ................... 358/191.1
4,326,296 A *  4/1982 Rafter et al. ................. 455/192
4,491,976 A *  1/1985 Saitoh ......................... 455/315
4,891,708 A *  1/1990 Baba ....................... 358/195.1

FOREIGN PATENT DOCUMENTS

JP          7-22974         1/1995

* cited by examiner

Primary Examiner—Victor R. Kostak

(57) ABSTRACT

A television tuner comprising: a frequency converter for frequency converting a received television signal into an intermediate frequency signal and outputting the intermediate frequency signal; and an intermediate frequency tuning circuit for passing the intermediate frequency signal, wherein the tuning frequency of the intermediate frequency tuning circuit is changed to a higher value in association with a rise in the ambient temperature.

3 Claims, 3 Drawing Sheets

TELEVISION TUNER WITH SUPPRESSED ATTENUATION OF LEVEL OF VIDEO INTERMEDIATE FREQUENCY WITH RESPECT TO RISE IN AMBIENT TEMPERATURE

BACKGROUND OF THE INVENTION

1. Field of the Invention

The present invention relates to a television tuner.

2. Description of the Related Art

A conventional television tuner will be described by referring to FIGS. 5 and 6. A television tuner comprises: a frequency converter 31 for frequency converting a received television signal to an intermediate frequency signal (hereinbelow, abbreviated as an IF signal) and outputting the IF signal; an intermediate frequency tuning circuit (hereinbelow, abbreviated as an IF tuning circuit) 32 for passing the IF signal outputted from the frequency converter 31; and an intermediate frequency amplifier 33 for amplifying the IF signal and outputting the amplified IF signal.

First, a television signal received by an antenna (not shown) is amplified by an amplifier (not shown) and the amplified signal is supplied to the frequency converter 31. The frequency converter 31 has first and second output terminals 31a and 31b and, although not shown, a voltage controlled oscillator and a mixer. In the mixer, an oscillation signal outputted from the voltage controlled oscillator is mixed with the television signal, thereby performing the frequency conversion and obtaining an IF signal. The IF signals are outputted from the first and second output terminals 31a and 31b in a balanced state. For example, in a television tuner complied with a domestic specification, a sound intermediate frequency SIF is 54.25 MHz, a color intermediate frequency CIF is 55.17 MHz and a picture intermediate frequency PIF is 58.75 MHz.

The IF tuning circuit 32 has a capacitor 32a and a tuning coil 32b. The capacitor 32a and the tuning coil 32b are connected in parallel. One end of the tuning coil 32b is connected to the first output terminal 31a of the frequency converter 31 and the other end of the tuning coil 32b is connected to the second output terminal 31b of the frequency converter 31. A tuning frequency f0 of the IF tuning circuit 32 is set so as to be almost a center frequency (57 MHz in the domestic specification) between the picture intermediate frequency PIF and the color intermediate frequency CIF.

The intermediate frequency amplifier 33 is connected to both ends of the tuning coil 32b via coupling capacitors 34 and 35. The IF signals outputted from the frequency converter 31 pass through the IF tuning circuit 32 and are supplied to the intermediate frequency amplifier 33 in a balanced state. The IF signals are amplified and outputted.

As shown by a solid line in FIG. 6, the level of the IF signal outputted from the IF tuning circuit 32 becomes the maximum value (point A) at the tuning frequency f0. An output characteristic drawing a curve of the level of the IF signal, which is gradually lowered as the frequency becomes higher or lower than the tuning frequency f0 is obtained. The level of the picture intermediate frequency PIF is lower than that at the tuning frequency f0 (point B). Similarly, the level of each of the color intermediate frequency CIF and the sound intermediate frequency SIF is lower than that at the tuning frequency f0 (points C and D).

For example, transistors (not shown) are used for the mixer of the frequency converter 31 and an amplifier (not shown) provided at the front stage of the frequency converter 31. Generally, the gain of the transistor decreases when the ambient temperature rises. In the output characteristic of the IF signal of the frequency converter 31, as shown by a broken line in FIG. 6, the gain decreases as a whole. Consequently, as shown by broken lines in FIG. 6, the levels of the sound intermediate frequency signal SIF and the picture intermediate frequency signal PIF decrease from the points D and B to points D' and B', respectively. Especially, the decrease in the level of the picture intermediate frequency signal PIF causes a problem such that the S/N ratio of an image displayed on a display of a television deteriorates.

SUMMARY OF THE INVENTION

The invention intends to solve the problem and its object is to suppress attenuation of the level of a picture intermediate frequency PIF when the ambient temperature rises.

In order to solve the problem, according to the invention, there is provided a television tuner comprising: a frequency converter for frequency converting a received television signal into an intermediate frequency signal and outputting the intermediate frequency signal; and an intermediate frequency tuning circuit for passing the intermediate frequency signal, wherein a tuning frequency of the intermediate frequency tuning circuit is changed to a higher value in association with a rise in the ambient temperature.

According to the television tuner of the invention, the intermediate frequency tuning circuit has at least a capacitor and a coil, and a capacitor having a negative temperature characteristic is used as the capacitor.

According to the television tuner of the invention, when the tuning frequency of the intermediate frequency tuning circuit is set to an almost center frequency between a picture intermediate frequency and a color intermediate frequency of the television signal at a specific temperature in an ordinary temperature range, the tuning frequency when the ambient temperature rises by 25° C. is set to be higher than the frequency which is the almost center between the picture intermediate frequency and the color intermediate frequency of the television signal and lower than the picture intermediate frequency.

DETAILED DESCRIPTION OF THE PREFERRED EMBODIMENTS

Figure 1:
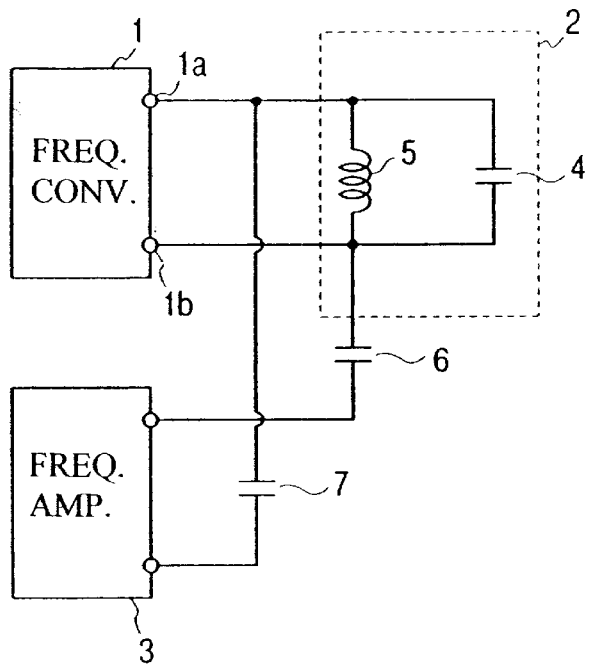
FIG. 1 is a circuit diagram of a television tuner of the invention.
Figure 2:
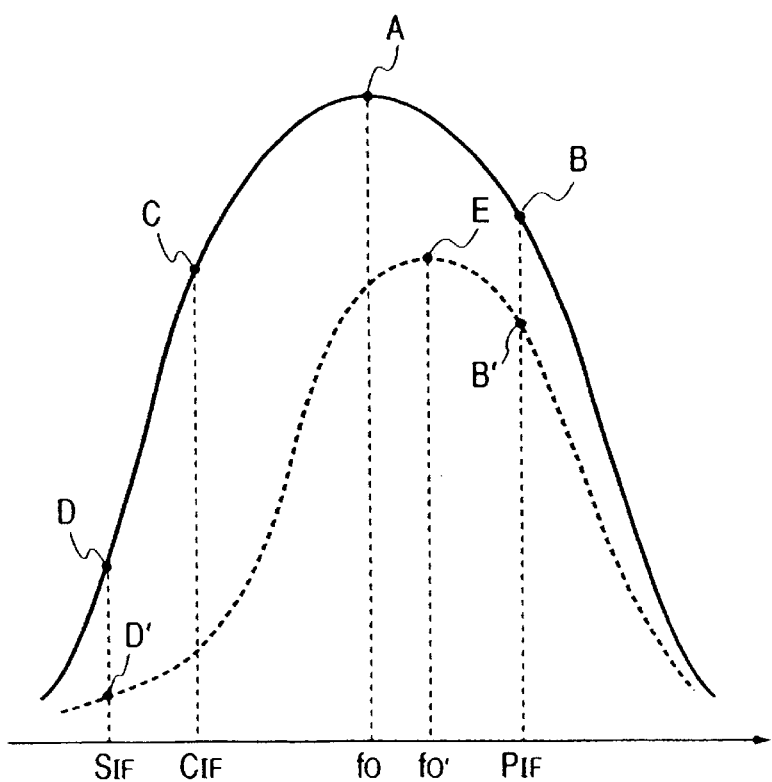
FIG. 2 is a graph showing output characteristics of an intermediate frequency tuning circuit in the television tuner of the invention.
Figure 3:
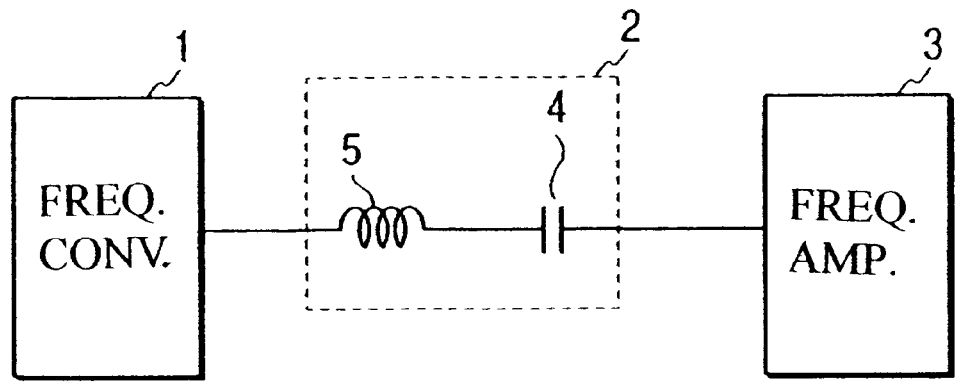
FIG. 3 is a circuit diagram showing another embodiment of the television tuner of the invention.
Figure 4:
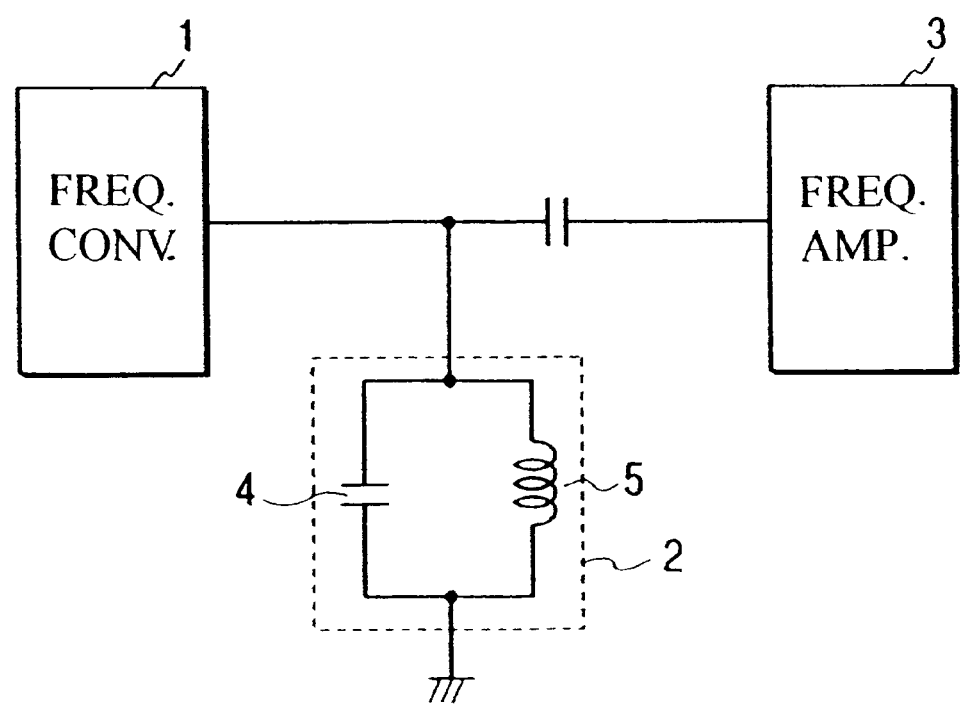
FIG. 4 is a circuit diagram showing another embodiment of the television tuner of the invention.
Figure 5:
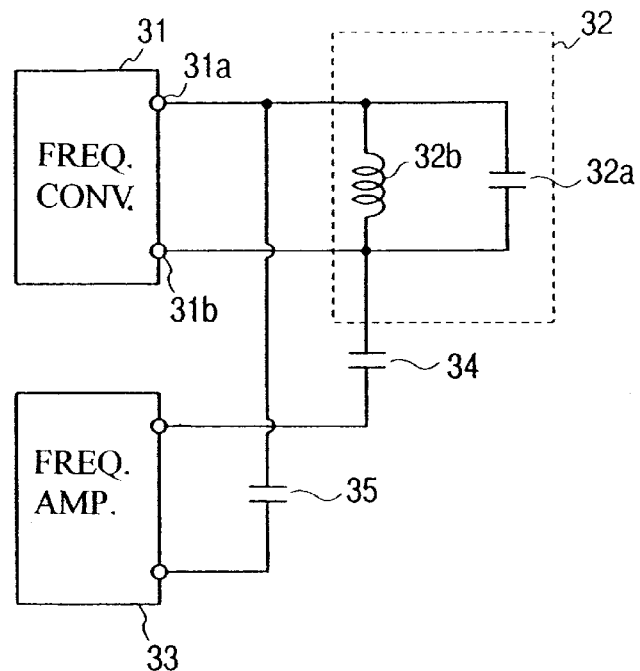
FIG. 5 is a circuit diagram of a conventional television tuner.
Figure 6:
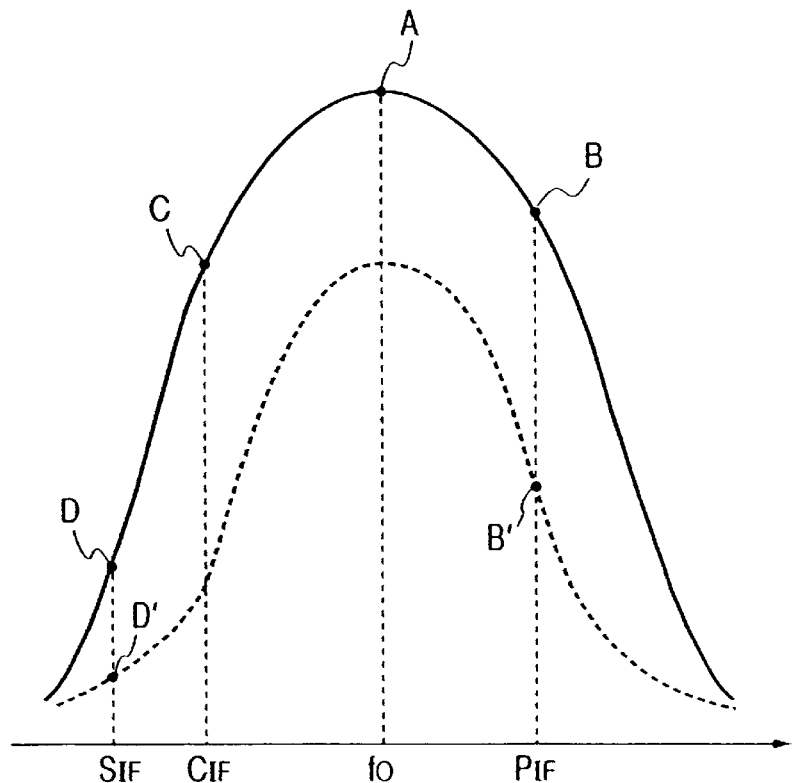
FIG. 6 is a graph showing output characteristics of an intermediate frequency tuning circuit in the conventional television tuner.

A television tuner of the invention will be described with reference to FIGS. 1 to 4. FIG. 1 is a circuit diagram of the television tuner of the invention. FIG. 2 is a graph of an output characteristic of an intermediate frequency tuning circuit of the television tuner of the invention. FIGS. 3 and 4 are circuit diagrams of another embodiment of the television tuner of the invention.

The television tuner of the invention comprises a frequency converter 1 for frequency converting a television signal to an intermediate frequency (hereinbelow, abbreviated as an IF signal) and outputting the IF signal, an intermediate frequency tuning circuit (hereinbelow, abbreviated as an IF tuning circuit) 2 for passing the IF signal outputted from the frequency converter 1, and an intermediate frequency amplifier 3 for amplifying the IF signal and outputting the amplified IF signal.

First, a television signal received by an antenna (not shown) is amplified by an amplifier (not shown) and the amplified signal is supplied to the frequency converter 1. The frequency converter 1 has first and second output terminals 1a and 1b and, although not shown, a voltage controlled oscillator and a mixer. In the mixer, an oscillation signal outputted from the voltage controlled oscillator is mixed with the television signal, thereby performing the frequency conversion to obtain an IF signal. The IF signals are outputted from the first and second output terminals 1a and 1b in a balanced state. For example, in a television tuner compliant with specifications for Japan, the sound intermediate frequency SIF is 54.25 MHz, the color intermediate frequency CIF is 55.17 MHz and the picture intermediate frequency PIF is 58.75 MHz.

The IF tuning circuit 2 comprises a capacitor 4 having a negative temperature characteristic and a tuning coil 5. The capacitor 4 and the tuning coil 5 are connected in parallel. One end of the tuning coil 5 is connected to the first output terminal 1a of the frequency converter 1 and the other end of the tuning coil 5 is connected to the second output terminal 1b of the frequency converter 1.

The temperature characteristic of the capacitor 4 is as shown by the solid line in FIG. 2. The level of the IF signal reaches the maximum value (point A) when a tuning frequency f0 of the IF tuning circuit 2 at a specific temperature (for example, 25° C.) in an ordinary temperature range (for example, 20° C. to 25° C.) is equal to almost a center frequency (57 MHz in the domestic specification) between the color intermediate frequency CIF (55.17 MHz) and the picture intermediate frequency PIF (58.75 MHz). For example, when the temperature rises from the ordinary temperature by 25° C., as shown by a broken line in FIG. 2, an output characteristic such that the level of the IF signal reaches the maximum value (point E) at a tuning frequency f0' of the IF tuning circuit 2 which is higher than the tuning frequency f0 at the time of the ordinary temperature and lower than the picture intermediate frequency PIF is obtained. Consequently, the tuning frequency f0' after the rise in the ambient temperature is closer to the picture intermediate frequency PIF than the tuning frequency f0.

As shown in FIG. 2, the level of the IF signal becomes higher as the frequency becomes closer to the tuning frequency f0. The tuning frequency f0 becomes f0' (point E) as the ambient temperature rises and the tuning frequency f0' is closer to the picture intermediate frequency PIF. Consequently, the difference between the level of the tuning frequency f0' and the level of the picture intermediate frequency PIF is reduced as compared with that of the conventional technique, so that the attenuation of the level of the picture intermediate frequency PIF when the ambient temperature of the television tuner becomes high can be suppressed.

Since the tuning frequency f0 at the specified temperature is set to be a center frequency between the color intermediate frequency CIF and the picture intermediate frequency PIF, when the level of the IF signal attenuates due to a change in temperature, it is prevented that the level of the sound intermediate frequency SIF decreases more than necessary and a sound output deteriorates.

Both ends of the tuning coil 5 are connected to the intermediate frequency amplifier 3 via coupling capacitors 6 and 7. The IF signals outputted from the frequency converter 1 pass through the IF tuning circuit 2 and are supplied to the intermediate frequency amplifier 3. The IF signals are amplified by the intermediate frequency amplifier 3 and the amplified signals are outputted.

Although the case where the IF signals are outputted in parallel from the frequency converter 1 has been described, the IF signals are not necessarily outputted in a balanced state from the frequency converter 1. It is also possible to connect the capacitor 4 and the tuning coil 5 in series in the intermediate frequency circuit 2 as shown in FIG. 3 or to connect the capacitor 4 and the tuning coil 5 in parallel as shown in FIG. 4. In the other configurations as well, similar effects can be produced.

As described above, the television tuner of the invention comprises: the frequency converter for frequency converting a received television signal into an intermediate frequency signal and outputting the intermediate frequency signal; the intermediate frequency tuning circuit for passing the intermediate frequency signal; and the amplifier for amplifying the intermediate frequency signal and outputting the amplified signal, and the tuning frequency of the intermediate frequency tuning circuit is changed to a higher value in association with a rise in the ambient temperature. Consequently, the difference between the tuning frequency f0' and the picture intermediate frequency PIF is reduced, thereby enabling the attenuation of the level of the picture intermediate frequency PIF to be suppressed.

According to the television tuner of the invention, the intermediate frequency tuning circuit has at least the capacitor having a negative temperature characteristic and the tuning coil. The intermediate frequency tuning circuit is constructed by connecting the capacitor and the tuning coil in parallel, thereby enabling the television tuner with a suppressed attenuation of the picture intermediate frequency signal PIF even when the ambient temperature rises to be provided.

According to the television tuner of the invention, when the tuning frequency of the intermediate frequency tuning circuit is set to an almost center frequency between the picture intermediate frequency and the color intermediate frequency of the television signal at a specific temperature in an ordinary temperature range, the tuning frequency when the ambient temperature rises by 25° C. is set to be higher than the frequency which is the almost center between the picture intermediate frequency and the color intermediate frequency of the television signal and lower than the picture intermediate frequency. Consequently, it can prevent that the level of the sound intermediate frequency SIF decreases more than necessary at the time of a rise in the ambient temperature and the sound output deteriorates.

What is claimed is:

1. A television tuner comprising:
   a frequency converter for frequency converting a received television signal into an intermediate frequency signal and outputting the intermediate frequency signal; and
   an intermediate frequency tuning circuit for passing the intermediate frequency signal, wherein a tuning frequency of the intermediate frequency tuning circuit is changed to a higher value in association with a rise in the ambient temperature so that the tuning frequency of the intermediate frequency tuning circuit after the rise in the ambient temperature becomes higher than the tuning frequency of the intermediate frequency circuit before the rise in the ambient temperature.

2. A television tuner according to claim 1, wherein the intermediate frequency tuning circuit has at least a capacitor and a coil and a capacitor having a negative temperature characteristic is used as the capacitor.

3. A television tuner according to claim 2, wherein when the tuning frequency of the intermediate frequency tuning circuit is set to an almost center frequency between a picture intermediate frequency and a color intermediate frequency of the television signal at a specific temperature in an ordinary temperature range, the tuning frequency after the ambient temperature rises by 25° C. is set to be higher than the frequency which is the almost center frequency between the picture intermediate frequency before the ambient temperature rises by 25° C. and the color intermediate frequency of the television signal before the ambient temperature rises by 25° C. and lower than the picture intermediate frequency before the ambient temperature rises by 25° C.

* * * * *